(12) United States Patent
Yoon

(10) Patent No.: US 11,409,598 B2
(45) Date of Patent: Aug. 9, 2022

(54) SEMICONDUCTOR DEVICES

(71) Applicant: SK hynix Inc., Icheon-si (KR)

(72) Inventor: Sang Sic Yoon, Yongin-si (KR)

(73) Assignee: SK hynix Inc., Gyeonggi-do (KR)

( * ) Notice: Subject to any disclaimer, the term of this patent is extended or adjusted under 35 U.S.C. 154(b) by 74 days.

(21) Appl. No.: 16/909,019

(22) Filed: Jun. 23, 2020

(65) Prior Publication Data

US 2021/0294693 A1 Sep. 23, 2021

(30) Foreign Application Priority Data

Mar. 17, 2020 (KR) .......................... 10-2020-0032663

(51) Int. Cl.
| | |
|---|---|
| *G06F 11/10* | (2006.01) |
| *H03M 13/15* | (2006.01) |
| *G11C 7/10* | (2006.01) |
| *G11C 29/44* | (2006.01) |
| *G11C 29/52* | (2006.01) |
| *G06F 11/07* | (2006.01) |
| *G11C 11/4096* | (2006.01) |

(52) U.S. Cl.
CPC ............ *G06F 11/1044* (2013.01); *G11C 7/10* (2013.01); *G11C 29/44* (2013.01); *H03M 13/151* (2013.01); *G06F 11/073* (2013.01); *G06F 11/0793* (2013.01); *G06F 11/1048* (2013.01); *G11C 7/1006* (2013.01); *G11C 11/4096* (2013.01); *G11C 29/52* (2013.01); *G11C 2211/4062* (2013.01)

(58) Field of Classification Search
CPC ............... G06F 11/073; G06F 11/0793; G06F 11/1044; G06F 11/1048; G11C 11/4096; G11C 7/1006; G11C 29/52; G11C 7/10; G11C 29/44; G11C 2211/4062; H03M 13/151

See application file for complete search history.

(56) References Cited

U.S. PATENT DOCUMENTS

| 2017/0147431 A1* | 5/2017 | West ...................... G11C 29/52 |
| 2020/0012558 A1* | 1/2020 | Hsieh .................. G06F 11/1076 |

FOREIGN PATENT DOCUMENTS

| KR | 101906409 B1 | 12/2018 |
| WO | 2017087075 A1 | 5/2017 |

* cited by examiner

*Primary Examiner* — April Y Blair
*Assistant Examiner* — Sazzad Hossain
(74) *Attorney, Agent, or Firm* — William Park & Associates Ltd.

(57) ABSTRACT

A semiconductor device includes a selection input circuit and a core data generation circuit. The selection input circuit is configured to generate selection data, a selection parity, and a selection data control signal from data, a parity, and a data control signal during a write operation and sets the selection data, the selection parity, and the selection data control signal to a predetermined logic level during a pattern write operation. The core data generation circuit is configured to receive drive data, a drive parity, and a drive data control signal driven by the selection data, the selection parity, and the selection data control signal to generate core data which are stored into a memory core according to whether an error correction operation and a data inversion operation is performed.

20 Claims, 8 Drawing Sheets

FIG.3

| CS | CLK | CA<1> | CA<2> | CA<3> | CA<4> | CA<5> | CA<6> | CA<7> |
|---|---|---|---|---|---|---|---|---|
| H | rising | L | L | H | H | X | X | X |
| X | falling | L | L | L | L | WRX | WXSA | WXSB |

SEMICONDUCTOR DEVICES

CROSS-REFERENCE TO RELATED APPLICATIONS

The present application claims priority under 35 U.S.C. 119(a) to Korean Patent Application No. 10-2020-0032663, filed on Mar. 17, 2020, which is incorporated herein by reference in its entirety.

BACKGROUND

1. Technical Field

Embodiments of the present disclosure relate to semiconductor devices performing a pattern write operation.

2. Related Art

Semiconductor devices such as dynamic random access memory (DRAM) devices perform a write operation and a read operation. The write operation is performed to store data into a bank including cell arrays accessed with an address, and the read operation is performed to output the data stored in the cell arrays included in the bank.

SUMMARY

According to an embodiment, a semiconductor device includes a selection input circuit and a core data generation circuit. The selection input circuit is configured to generate selection data, a selection parity, and a selection data control signal from data, a parity, and a data control signal during a write operation. In addition, the selection input circuit is configured to set the selection data, the selection parity, and the selection data control signal to a predetermined logic level during a pattern write operation. The core data generation circuit is configured to receive drive data, a drive parity, and a drive data control signal driven by the selection data, the selection parity, and the selection data control signal to generate core data which are stored into a memory core according to whether an error correction operation and a data inversion operation is performed.

According to another embodiment, a semiconductor device includes a selection data generation circuit, a selection parity generation circuit, a selection flag generation circuit, and a core data generation circuit. The selection data generation circuit is configured to generate selection data from data during a write operation and is configured to set the selection data based on a pattern control flag during a pattern write operation. The selection parity generation circuit is configured to generate a selection parity from a parity during the write operation and is configured to set the selection parity to a first logic level during the pattern write operation. The selection flag generation circuit is configured to generate a selection data control signal from a data control signal during the write operation and is configured to set the data control signal to a second logic level during the pattern write operation. The core data generation circuit is configured to receive drive data, a drive parity, and a drive data control signal driven by the selection data, the selection parity, and the selection data control signal to generate core data which are stored into a memory core according to whether an error correction operation and a data inversion operation are performed.

BRIEF DESCRIPTION OF THE DRAWINGS

FIG. 3 is a table illustrating conditions for generating a pattern write command, a first pattern control flag, and a second pattern control flag for a pattern write operation.

FIG. 5 is a table illustrating a configuration of an error check matrix used for generation of a syndrome in a syndrome generation circuit included in the write operation circuit illustrated in FIG. 4.

FIG. 8 is a table illustrating a logic level combination of data inputted to the write operation circuit illustrated in FIG. 7.

DETAILED DESCRIPTION OF THE EMBODIMENTS

In the following description of the embodiments, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed.

It will be understood that although the terms "first," "second," "third," etc. are used herein to describe various elements, these elements should not be limited by these terms. These terms are only used to distinguish one element from another element and not to suggest an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to different embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
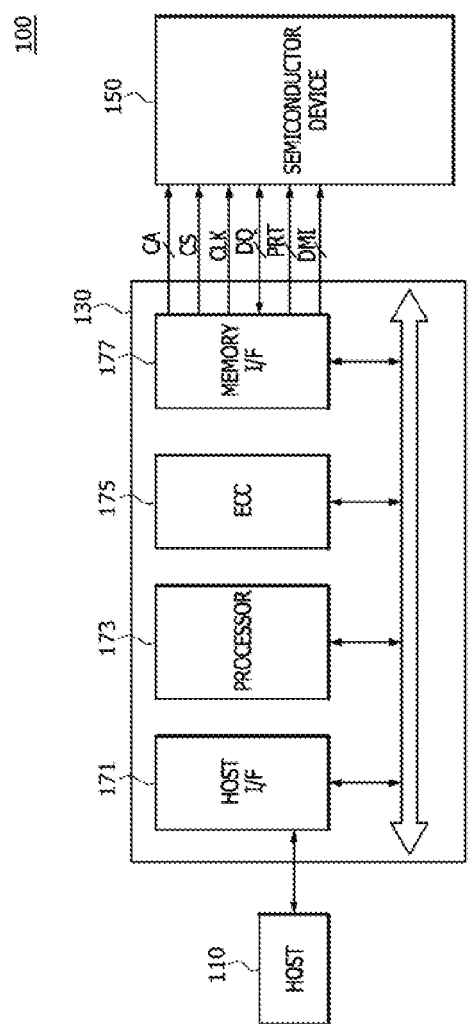
FIG. 1 is a block diagram illustrating a configuration of a semiconductor system according to an embodiment of the present disclosure.

FIG. 1 is a block diagram illustrating a configuration of a semiconductor system 100 according to an embodiment of the present disclosure. As illustrated in FIG. 1, the semiconductor system 100 may include a host 110, a controller 130, and a semiconductor device 150.

The host 110 may manage and control the overall function and operation of the host 110 using an operating system (OS) and may control an interaction between the controller 130 and the semiconductor device 150. The operating system may be divided into a general operating system and a mobile operating system. The general operating system may be divided into a personal operating system and a company operating system. The personal operating system is a system specialized to support a service provision function for general users and may include Windows and Chrome. The company operating system is a system specialized to secure and support high performance and may include a Windows server, Linux, Unix, and so on. The mobile operating system is a system specialized to support a mobile service provision function and a power saving function of a system for users and may include Android, iOS, Windows mobile, and so on. The host 110 may execute an operating system to control an operation between the controller 130 and the semiconductor device 150 according to a user request.

The controller 130 may include a host interface unit 171, a processor 173, an error correction code (ECC) unit 175, and a memory interface unit 177.

The host interface unit 171 may process commands and data outputted from the host 110 and may be set to communicate with the host 110 using at least one of various interface protocols such as Universal Serial Bus (USB), multi-media card (MMC), peripheral component interconnect-express (PCI-E), serial-attached SCSI(SAS), serial advanced technology attachment (SATA), parallel advanced technology attachment (PATA), small computer system interface (SCSI), enhanced small disk interface (ESDI), integrated drive electronics (IDE), and mobile industry processor interface (MIPI).

The processor 173 may control overall operations of the controller 130 for controlling the semiconductor device 150 according to a request of the host 110. For example, the processor 173 may control a write operation or a read operation for the semiconductor device 150 when a write request or a read request is outputted from the host 110. The processor 173 may be realized using a microprocessor or a central processing unit (CPU).

The ECC unit 175 may correct an erroneous bit of data which are processed by the semiconductor device 150 and may include an ECC encoder and an ECC decoder. The ECC encoder may generate a parity PRT by performing an error correction encoding operation of data DQ which are applied to the semiconductor device 150. The ECC decoder may detect and correct an error of the data DQ received from the semiconductor device 150. The ECC unit 175 may correct an error using coded modulation such as a low density parity check (LDPC) code, a Bose-Chaudhri-Hocquenghem (BCH) code, a turbo code, a Reed-Solomon code, a convolution code, a recursive systematic code (RSC), trellis-coded modulation (TCM), or block coded modulation (BCM) according to embodiments, but not limited thereto.

In order that the controller 130 controls the semiconductor device 150 in response to a request of the host 110, the memory interface unit 177 may apply a control signal CA, a chip selection signal CS, a clock signal CLK, the data DQ, the parity PRT, and a data control signal DMI to the semiconductor device 150 and may receive the data DQ from the semiconductor device 150.

The semiconductor device 150 may receive the control signal CA, the chip selection signal CS, the clock signal CLK, the data DQ, the parity PRT, and the data control signal DMI to perform an error correction operation, a write operation including a data masking operation and a data inversion operation, and a pattern write operation.

Figure 2:
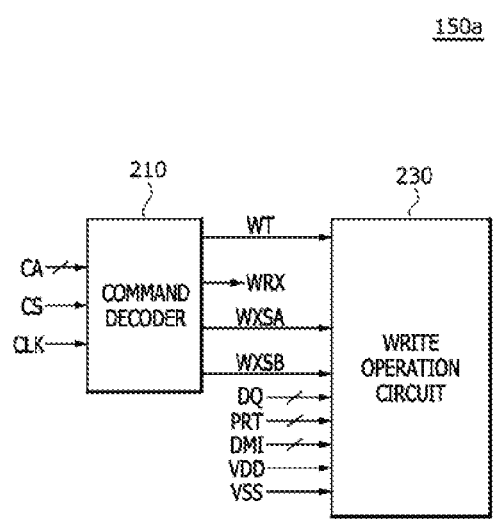
FIG. 2 is a block diagram illustrating a configuration of a semiconductor device included in the semiconductor system illustrated in FIG. 1.

FIG. 2 is a block diagram illustrating a configuration of a semiconductor device 150a corresponding to the semiconductor device 150 illustrated in FIG. 1. As illustrated in FIG. 2, the semiconductor device 150a may include a command decoder 210 and a write operation circuit 230.

The command decoder 210 may generate a write command signal WT, a pattern write command signal WRX, a first pattern control flag WXSA, and a second pattern control flag WXSB based on the control signal CA, the chip selection signal CS, and the clock signal CLK. The command decoder 210 may selectively generate one of the write command signal WT, the pattern write command signal WRX, the first pattern control flag WXSA, and the second pattern control flag WXSB according to a logic level combination of bits included in the control signal CA inputted to the command decoder 210 based on the chip selection signal CS and the clock signal CLK. The write command signal WT may be generated to perform a write operation for storing core data (CDQ of FIG. 4) generated based on the data DQ into a memory core (39 of FIG. 4). The pattern write command signal WRX may be generated to perform a pattern write operation for storing the core data CDQ having a predetermined logic level into the memory core 39 regardless of the data DQ. The first pattern control flag WXSA may be generated to store the core data CDQ having a first logic level into the memory core 39 during the pattern write operation. The second pattern control flag WXSB may be generated to store the core data CDQ having a second logic level into the memory core 39 during the pattern write operation. In the present embodiment, the first logic level may be set to be a logic "low" level, and the second logic level may be set to be a logic "high" level. However, the present disclosure is not limited thereto. Logic level combinations of bits included in the control signal CA for generating the write command signal WT, the pattern write command signal WRX, the first pattern control flag WXSA, and the second pattern control flag WXSB may be set to be different according to the embodiments.

The write operation circuit 230 may receive the data DQ, the parity PRT, the data control signal DMI, a power supply voltage VDD, and a ground voltage VSS to perform an error correction operation, a write operation including a data masking operation and a data inversion operation, and a pattern write operation, based on the write command signal WT, the pattern write command signal WRX, the first pattern control flag WXSA, and the second pattern control flag WXSB. The write operation circuit 230 may store the core data CDQ generated based on the data DQ into the memory core 39 when the write command signal WT is generated to perform the write operation. The write operation circuit 230 may store the core data CDQ having logic levels set by the first pattern control flag WXSA and the second pattern control flag WXSB into the memory core 39 when the pattern write command signal WRX is generated to perform the pattern write operation.

FIG. 3 is a table illustrating conditions for generating the pattern write command signal WRX, the first pattern control flag WXSA, and the second pattern control flag WXSB for the pattern write operation. As illustrated in FIG. 3, the pattern write command signal WRX may be generated by a fifth bit CA<5> of the control signal CA in synchronization with a falling edge of the clock signal CLK while the chip selection signal CS is set to be "H" (hereinafter, a logic "high" level), first and second bits CA<1:2> of the control signal CA are set to be "L" (hereinafter, a logic "low" level) in synchronization with a rising edge of the clock signal CLK, and third and fourth bits CA<3:4> of the control signal CA are set to be a logic "high" level in synchronization with the rising edge of the clock signal CLK. The first pattern control flag WXSA may be generated by a sixth bit CA<6> of the control signal CA in synchronization with the falling edge of the clock signal CLK while the chip selection signal CS is set to have a logic "high" level, the first and second bits CA<1:2> of the control signal CA are set to have a logic "low" level in synchronization of the rising edge of the clock signal CLK, and the third and fourth bits CA<3:4> of the control signal CA are set to have a logic "high" level in synchronization of the rising edge of the clock signal CLK. The second pattern control flag WXSB may be generated by a seventh bit CA<7> of the control signal CA in synchronization with the falling edge of the clock signal CLK while the chip selection signal CS is set to have a logic "high" level, the first and second bits CA<1:2> of the control signal CA are set to have a logic "low" level in synchronization of the rising edge of the clock signal CLK, and the third and fourth bits CA<3:4> of the control signal CA are set to have a logic "high" level in synchronization of the rising edge of the clock signal CLK.

Figure 4:
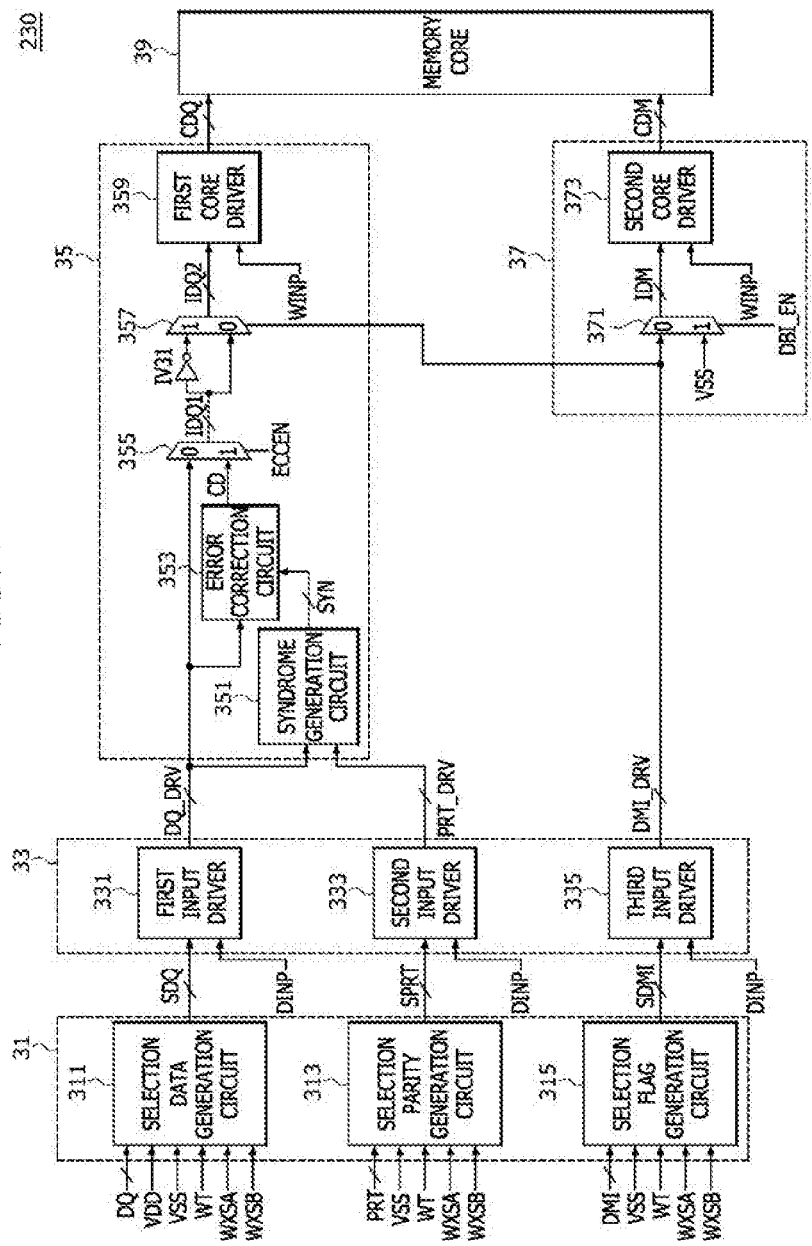
FIG. 4 illustrates a configuration of a write operation circuit included in the semiconductor device illustrated in FIG. 2.

FIG. 4 illustrates a configuration of the write operation circuit 230 in accordance with an embodiment. As illustrated in FIG. 4, the write operation circuit 230 may include a selection input circuit 31, an input drive circuit 33, a core data generation circuit 35, a data masking control circuit 37, and the memory core 39.

The selection input circuit 31 may generate selection data SDQ from the data DQ, may generate a selection parity SPRT from the parity RPT, and may generate a selection data control signal SDMI from the data control signal DMI, during a write operation. The selection input circuit 31 may set the selection data SDQ to the power supply voltage VDD or the ground voltage VSS during a pattern write operation. The selection input circuit 31 may set the selection parity SPRT and the selection data control signal SDMI to the ground voltage VSS during a pattern write operation. The selection input circuit 31 may include a selection data generation circuit 311, a selection parity generation circuit 313, and a selection flag generation circuit 315.

The selection data generation circuit 311 may generate the selection data SDQ based on the data DQ, the power supply voltage VDD, the ground voltage VSS, the write command signal WT, the first pattern control flag WXSA, and the second pattern control flag WXSB. The selection data generation circuit 311 may output the data DQ as the selection data SDQ when the write operation is performed based on the write command signal WT. The selection data generation circuit 311 may output the ground voltage VSS as the selection data SDQ when the first pattern control flag WXSA is generated during the pattern write operation. The selection data generation circuit 311 may output the power supply voltage VDD as the selection data SDQ when the second pattern control flag WXSB is generated during the pattern write operation.

The selection parity generation circuit 313 may generate the selection parity SPRT based on the parity PRT, the ground voltage VSS, the write command signal WT, the first pattern control flag WXSA, and the second pattern control flag WXSB. The selection parity generation circuit 313 may output the parity PRT as the selection parity SPRT when the write command signal WT is generated to perform the write operation. The selection parity generation circuit 313 may output the ground voltage VSS as the selection parity SPRT when the first pattern control flag WXSA or the second pattern control flag WXSB is generated during the pattern write operation. In the present embodiment, the selection parity SPRT may be driven to the ground voltage VSS to prevent an error correction operation from being performed during the pattern write operation, but the selection parity SPRT may be driven to a logic level different from a logic level of the ground voltage VSS according to the embodiments.

The selection flag generation circuit 315 may generate the selection data control signal SDMI based on the data control signal DMI, the ground voltage VSS, the write command signal WT, the first pattern control flag WXSA, and the second pattern control flag WXSB. The selection flag generation circuit 315 may output the data control signal DMI as the selection data control signal SDMI when the write command signal WT is generated to perform the write operation. The selection flag generation circuit 315 may output the ground voltage VSS as the selection data control signal SDMI when the first pattern control flag WXSA or the second pattern control flag WXSB is generated during the pattern write operation. In the present embodiment, the selection data control signal SDMI may be driven to the ground voltage VSS to prevent a data inversion operation and a data masking operation from being performed during the pattern write operation, but the selection data control signal SDMI may be driven to a logic level different from a logic level of the ground voltage VSS according to the embodiments.

The input drive circuit 33 may generate drive data DQ_DRV, a drive parity PRT_DRV, and a drive data control signal DMI_DRV based on the selection data SDQ, the selection parity SPRT, and the selection data control signal SDMI when the write operation or the pattern write operation is performed. The input drive circuit 33 may include a first input driver 331, a second input driver 333, and a third input driver 335.

The first input driver 331 may generate the drive data DQ_DRV based on a data input pulse DINP and the selection data SDQ. The data input pulse DINP may be generated when the write operation or the pattern write operation is performed. The data input pulse DINP may be generated at a point in time when a predetermined input delay period elapses from a point in time when the write command signal WT or the pattern write command signal WRX is generated. The predetermined input delay period may be set to be different according to the embodiments. The first input driver 331 may drive the drive data DQ_DRV to the same logic level as the selection data SDQ when the write operation or the pattern write operation is performed to generate the data input pulse DINP.

The second input driver 333 may generate the drive parity PRT_DRV based on the data input pulse DINP and the selection parity SPRT. The second input driver 333 may drive the drive parity PRT_DRV to the same logic level as the selection parity SPRT when the write operation or the pattern write operation is performed to generate the data input pulse DINP.

The third input driver 335 may generate the drive data control signal DMI_DRV based on the data input pulse DINP and the selection data control signal SDMI. The third input driver 335 may drive the drive data control signal DMI_DRV to the same logic level as the selection data control signal SDMI when the write operation or the pattern write operation is performed to generate the data input pulse DINP.

The core data generation circuit 35 may generate the core data CDQ based on the drive data DQ_DRV, the drive parity PRT_DRV, an error correction activation signal ECCEN, the drive data control signal DMI_DRV, and a write input pulse WINP. The error correction activation signal ECCEN may be generated to have a logic "high" level when an error correction operation is performed. The core data generation circuit 35 may generate first internal data IDQ1 from the drive data DQ_DRV when the error correction operation is not performed and may generate the first internal data IDQ1 from correction data CD generated by correcting an error included in the drive data DQ_DRV when the error correction operation is performed. The core data generation circuit 35 may generate second internal data IDQ2 from the first internal data IDQ1 when a data inversion operation is not performed and may generate the second internal data IDQ2 by inversely buffering the first internal data IDQ1 when the data inversion operation is performed. The write input pulse WINP may be generated at a point in time when a predetermined write input delay period elapses from a point in time when the write command signal WT or the pattern write command signal WRX is generated. The predetermined write input delay period is set to be longer than the predetermined input delay period, for some embodiments. The core data generation circuit 35 may drive the core data CDQ based on the second internal data IDQ2 when the write input pulse WINP is generated.

The core data generation circuit 35 may include a syndrome generation circuit 351, an error correction circuit 353, a first internal data selection circuit 355, an inverter IV31, a second internal data generation circuit 357, and a first core driver 359 which are electrically connected in sequential order. The syndrome generation circuit 351 may generate a syndrome SYN based on the drive data DQ_DRV and the drive parity PRT_DRV. The syndrome generation circuit 351 may generate the syndrome SYN by performing a logical arithmetic operation of bits selected from bits included in the drive data DQ_DRV and the drive parity PRT_DRV according to an error check matrix used in the error correction code ECC. The syndrome SYN may include information on at least one erroneous bit among the bits included in the drive data DQ_DRV. The error correction circuit 353 may generate the correction data CD by correcting at least one erroneous bit among the bits included in the drive data DQ_DRV based on the syndrome SYN. The first internal data selection circuit 355 may output the drive data DQ_DRV or the correction data CD as the first internal data IDQ1 based on the error correction activation signal ECCEN. The first internal data selection circuit 355 may output the drive data DQ_DRV as the first internal data IDQ1 when the error correction activation signal ECCEN is not generated due to non-execution of the error correction operation. The first internal data selection circuit 355 may output the correction data CD as the first internal data IDQ1 when the error correction operation is performed to generate the error correction activation signal ECCEN. The inverter IV31 may inversely buffer the first internal data IDQ1 to output the inversely buffered data of the first internal data IDQ1. The second internal data generation circuit 357 may output an output signal of the inverter IV31 or the first internal data IDQ1 as the second internal data IDQ2 based on the drive data control signal DMI_DRV. The second internal data generation circuit 357 may output the output signal of the inverter IV31 as the second internal data IDQ2 based on the drive data control signal DMI_DRV when the data inversion operation is performed. The second internal data generation circuit 357 may output the first internal data IDQ1 as the second internal data IDQ2 based on the drive data control signal DMI_DRV when the data inversion operation is not performed. The first core driver 359 may generate the core data CDQ based on the write input pulse WINP and the second internal data IDQ2. The first core driver 359 may drive the core data CDQ to have the same logic level as the second internal data IDQ2 when the write operation or the pattern write operation is performed to generate the write input pulse WINP.

The data masking control circuit 37 may generate a data masking signal CDM based on the drive data control signal DMI_DRV, a data inversion activation signal DBI_EN, and the write input pulse WINP. The data inversion activation signal DBI_EN may be generated to have a logic "high" level when the data inversion operation is performed. Whether the data inversion operation is performed may be determined according to logic levels of bits included in the data DQ. For example, when the number of bits having a logic "high" level among bits included in the data DQ is greater than the number of bits having a logic "low" level among the bits included in the data DQ, the data inversion operation may be set to be performed. When the data inversion operation is performed, the data masking control circuit 37 may transmit the drive data control signal DMI_DRV to the core data generation circuit 35 such that the second internal data IDQ2 is generated from the inversely buffered data of the first internal data IDQ1. When the data inversion operation is performed, the data masking control circuit 37 may set an internal data masking signal IDM to the ground voltage VSS to prevent the data masking operation from being performed. When the data inversion operation is not performed, the data masking control circuit 37 may transfer the drive data control signal DMI_DRV as the internal data masking signal IDM. When the write input pulse WINP is generated, the data masking control circuit 37 may generate the data masking signal CDM from the internal data masking signal IDM.

The data masking control circuit 37 may include a data masking selection circuit 371 and a second core driver 373. The data masking selection circuit 371 may output the drive data control signal DMI_DRV or the ground voltage VSS as the internal data masking signal IDM based on the data inversion activation signal DBI_EN. The data masking selection circuit 371 may output the drive data control signal DMI_DRV as the internal data masking signal IDM when the data inversion activation signal DBI_EN has a logic "low" level because the data inversion operation is not performed. The data masking selection circuit 371 may output the ground voltage VSS as the internal data masking signal IDM when the data inversion activation signal DBI_EN has a logic "high" level because the data inversion operation is performed. The second core driver 373 may drive the data masking signal CDM to have the same logic level as the internal data masking signal IDM when the write operation or the pattern write operation is performed to generate the write input pulse WINP.

The memory core 39 may include a plurality of memory cell arrays (not illustrated) that store the core data CDQ based on the data masking signal CDM. When a masking operation is performed during the write operation, the memory core 39 may block storage of bits selected according to the data masking signal CDM among bits included in the core data CDQ.

Figure 5:
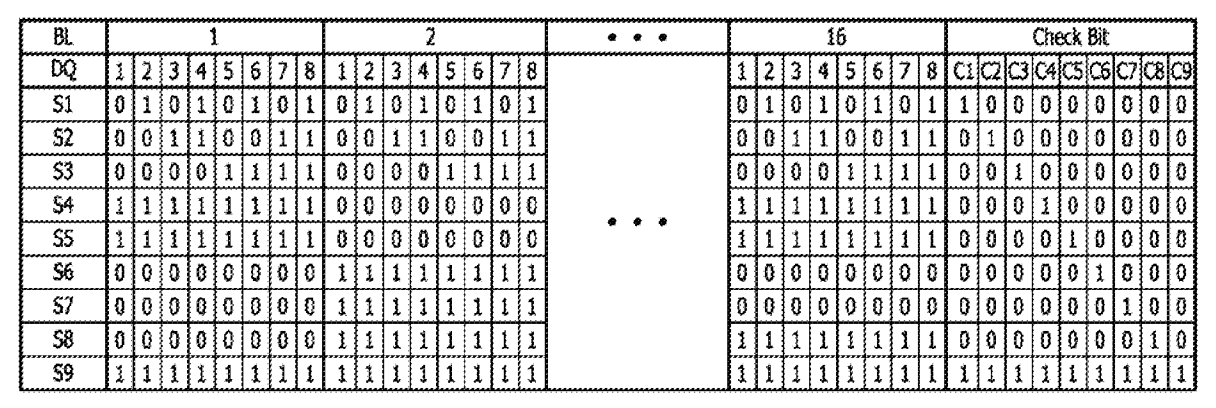

FIG. 5 is a table illustrating an error check matrix used to generate the syndrome SYN in the syndrome generation circuit 351. Referring to FIG. 5, first to ninth bits S1 to S9 of the syndrome SYN are generated by first to eighth bits DQ<1:8> of the data DQ for each bust length (BL) and first to ninth bits C1 to C9 of check bit. In the present embodiment, the first to eight bits DQ<1:8> may correspond to the data DQ inputted to respective ones of first to eighth data pins (not illustrated), the first to ninth bits C1 to C9 included in the check bit may correspond to the first to ninth bits PRT<1:9> of the parity PRT, and the syndrome SYN generated by the syndrome generation circuit 351 may include the first to ninth bits S1 to S9. For example, when the burst length is 2 (BL="2"), the third bit S3 of the syndrome may be generated by an exclusive OR operation of the fifth bit DQ<5> of the data, the sixth bit DQ<6> of the data, the seventh bit DQ<7> of the data, the eighth bit DQ<8> of the data, and the third bit C3 of the check bit. Erroneous bits among the first to eighth bits DQ<1:8> of the data may be confirmed by the first to eighth bits S1 to S8 of the syndrome generated by the syndrome generation circuit 351 for each burst length BL. For example, if the first to eighth bits S1 to S8 of the syndrome have data of "11011000" when the burst length BL is '1,' it means that the fourth bit DQ<4> of the data has an error. When all of the first to eighth bits S1 to S8 of the syndrome have a logic "low" level, it means that no error exists in the first to eighth bits DQ<1:8> of the data. When the ninth bit S9 of the syndrome has a logic "low" level, it means that two bits of the first to eighth bits DQ<1:8> of the data are erroneous bits.

The semiconductor device 150a having the aforementioned configuration may set the selection data SDQ to the power supply voltage VDD or the ground voltage VSS to use the syndrome generation circuit 351 and the error correction circuit 353, which are provided to perform the error correction operation, even for the pattern write operation without any design change of the syndrome generation circuit 351 and the error correction circuit 353. As a result, it may be possible to reduce a layout area and power consumption of the semiconductor device 150a. Further, the semiconductor device 150a may set the selection parity SPRT and the selection data control signal SDMI to the ground voltage VSS to use the second internal data generation circuit 357 provided to perform the data inversion operation and the data masking selection circuit 371 provided to perform the data masking operation even for the pattern write operation without any design change of the second internal data generation circuit 357 and the data masking selection circuit 371. As a result, it may also be possible to reduce a layout area and power consumption of the semiconductor device 150a.

Figure 6:
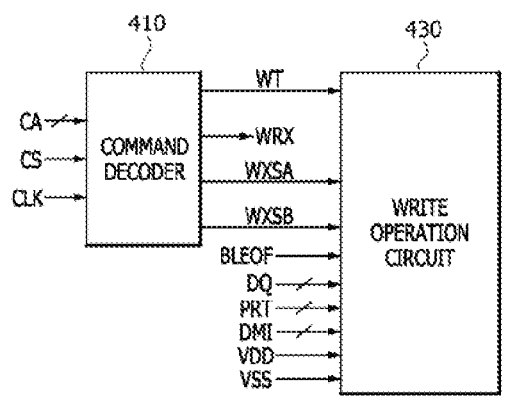
FIG. 6 is a block diagram illustrating a configuration of a semiconductor device included in the semiconductor system illustrated in FIG. 1.

FIG. 6 is a block diagram illustrating a configuration of a semiconductor device 150b corresponding to the semiconductor device 150 illustrated in FIG. 1. As illustrated in FIG. 6, the semiconductor device 150b may include a command decoder 410 and a write operation circuit 430.

The command decoder 410 may generate a write command signal WT, a pattern write command signal WRX, a first pattern control flag WXSA, and a second pattern control flag WXSB based on a control signal CA, a chip selection signal CS, and a clock signal CLK. The command decoder 410 may selectively generate one of the write command signal WT, the pattern write command signal WRX, the first pattern control flag WXSA, and the second pattern control flag WXSB according to a logic level of the chip selection signal CS and a logic level combination of bits included in the control signal CA inputted in synchronization with the clock signal CLK. The write command signal WT may be generated to perform a write operation for storing core data (CDQ of FIG. 7) generated based on the data DQ into a memory core (59 in FIG. 7). The pattern write command signal WRX may be generated to perform a pattern write operation for storing the core data CDQ having a predetermined logic level into the memory core 59 regardless of the data DQ. The first pattern control flag WXSA may be generated to store the core data CDQ having a first logic level into the memory core 59 during the pattern write operation. The second pattern control flag WXSB may be generated to store the core data CDQ having a second logic level into the memory core 59 during the pattern write operation. In the present embodiment, the first logic level may be set to be a logic "low" level and the second logic level may be set to be a logic "high" level, but the present disclosure is not limited thereto. Logic level combinations of bits included in the control signal CA for generating the write command signal WT, the pattern write command signal WRX, the first pattern control flag WXSA, and the second pattern control flag WXSB may be set to be different according to the embodiments.

The write operation circuit 430 may receive the data DQ, the parity PRT, the data control signal DMI, the power supply voltage VDD, and the ground voltage VSS to perform an error correction operation, a write operation including a data masking operation and a data inversion operation, and a pattern write operation, based on the write command signal WT, the pattern write command signal WRX, the first pattern control flag WXSA, the second pattern control flag WXSB, and a burst control flag BLEOF. The write operation circuit 430 may store the core data CDQ generated from the data DQ inputted based on the burst control flag BLEOF into the memory core 59 when the write command signal WT is generated to perform the write operation. The burst control flag BLEOF may be set to have a first logic level when a burst length BL is an odd number and may be set to have a second logic level when the burst length BL is an even number. The write operation circuit 430 may store the core data CDQ having logic levels set by the first pattern control flag WXSA and the second pattern control flag WXSB into the memory core 59 when the pattern write command signal WRX is generated to perform the pattern write operation.

Figure 7:
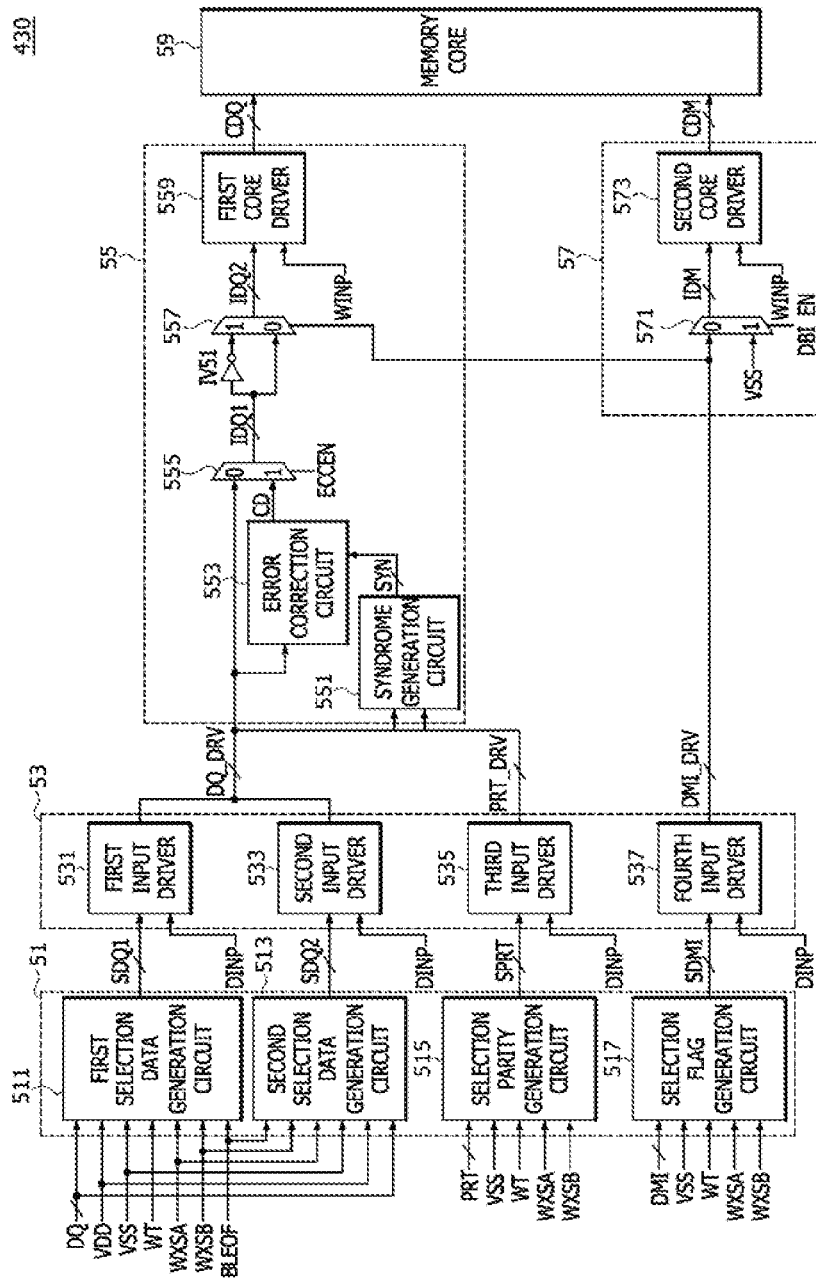
FIG. 7 illustrates a configuration of a write operation circuit included in the semiconductor device illustrated in FIG. 6.

FIG. 7 illustrates a configuration of the write operation circuit 430. As illustrated in FIG. 7, the write operation circuit 430 may include a selection input circuit 51, an input drive circuit 53, a core data generation circuit 55, a data masking control circuit 57, and the memory core 59.

The selection input circuit 51 may generate a first selection data SDQ1 and a second selection data SDQ2 from the data DQ, may generate a selection parity SPRT from the parity RPT, and may generate a selection data control signal SDMI from the data control signal DMI, during the write operation. The selection input circuit 51 may set the first selection data SDQ1 and the second selection data SDQ2 to the power supply voltage VDD or the ground voltage VSS during a pattern write operation. The selection input circuit 51 may set the selection parity SPRT and the selection data control signal SDMI to the ground voltage VSS during the pattern write operation. The selection input circuit 51 may include a first selection data generation circuit 511, a second selection data generation circuit 513, a selection parity generation circuit 515, and a selection flag generation circuit 517.

The first selection data generation circuit 511 may generate the first selection data SDQ1 based on the data DQ, the power supply voltage VDD, the ground voltage VSS, the write command signal WT, the first pattern control flag WXSA, the second pattern control flag WXSB, and the burst control flag BLEOF. The first selection data generation circuit 511 may output the data DQ as the first selection data SDQ1 when the write operation is performed while the burst control flag BLEOF has a first logic level and the write command signal WT is generated such that the burst length BL has an odd number. The first selection data generation circuit 511 may output the ground voltage VSS as the first selection data SDQ1 when the first pattern control flag WXSA is generated during the pattern write operation. The first selection data generation circuit 511 may output the power supply voltage VDD as the first selection data SDQ1 when the second pattern control flag WXSB is generated during the pattern write operation.

The second selection data generation circuit 513 may generate the second selection data SDQ based on the data DQ, the power supply voltage VDD, the ground voltage VSS, the write command signal WT, the first pattern control flag WXSA, the second pattern control flag WXSB, and the burst control flag BLEOF. The second selection data generation circuit 513 may output the data DQ as the second selection data SDQ2 when the write operation is performed while the burst control flag BLEOF has a second logic level and the write command signal WT is generated such that the burst length BL has an even number. The second selection data generation circuit 513 may output the ground voltage VSS as the second selection data SDQ2 when the first pattern control flag WXSA is generated during the pattern write operation. The second selection data generation circuit 513 may output the power supply voltage VDD as the second selection data SDQ2 when the second pattern control flag WXSB is generated during the pattern write operation.

The selection parity generation circuit 515 may generate the selection parity SPRT based on the parity PRT, the ground voltage VSS, the write command signal WT, the first pattern control flag WXSA, and the second pattern control flag WXSB. The selection parity generation circuit 515 may output the parity PRT as the selection parity SPRT when the write command signal WT is generated to perform the write operation. The selection parity generation circuit 515 may output the ground voltage VSS as the selection parity SPRT when the first pattern control flag WXSA or the second pattern control flag WXSB is generated during the pattern write operation. In the present embodiment, the selection parity SPRT may be driven to have the ground voltage VSS to prevent an error correction operation from being performed during the pattern write operation, but the selection parity SPRT may be driven to have a logic level different from a logic level of the ground voltage VSS according to the embodiments.

The selection flag generation circuit 517 may generate the selection data control signal SDMI based on the data control signal DMI, the ground voltage VSS, the write command signal WT, the first pattern control flag WXSA, and the second pattern control flag WXSB. The selection flag generation circuit 517 may output the data control signal DMI as the selection data control signal SDMI when the write command signal WT is generated to perform the write operation. The selection flag generation circuit 517 may output the ground voltage VSS as the selection data control signal SDMI when the first pattern control flag WXSA or the second pattern control flag WXSB is generated during the pattern write operation. In the present embodiment, the selection data control signal SDMI may be driven to have the ground voltage VSS to prevent a data inversion operation and a data masking operation from being performed during the pattern write operation, but the selection data control signal SDMI may be driven to have a logic level different from a logic level of the ground voltage according to the embodiments.

The input drive circuit 53 may generate a drive data DQ_DRV, a drive parity PRT_DRV, and a drive data control signal DMI_DRV based on the first selection data SDQ1, the second selection data SDQ2, the selection parity SPRT, and the selection data control signal SDMI when the write operation or the pattern write operation is performed. The input drive circuit 53 may include a first input driver 531, a second input driver 533, a third input driver 535, and a fourth input driver 537.

The first input driver 531 may generate the drive data DQ_DRV based on the data input pulse DINP and the first selection data SDQ1. The first input driver 531 may drive the drive data DQ_DRV to have the same logic level as the first selection data SDQ1 when the write operation or the pattern write operation is performed to generate the data input pulse DINP.

The second input driver 533 may generate the drive data DQ_DRV based on the data input pulse DINP and the second selection data SDQ2. The second input driver 533 may drive the drive data DQ_DRV to have the same logic level as the second selection data SDQ2 when the write operation or the pattern write operation is performed to generate the data input pulse DINP.

The third input driver 535 may generate the drive parity PRT_DRV based on the data input pulse DINP and the selection parity SPRT. The third input driver 535 may drive the drive parity PRT_DRV to have the same logic level as the selection parity SPRT when the write operation or the pattern write operation is performed to generate the data input pulse DINP.

The fourth input driver 537 may generate the drive data control signal DMI_DRV based on the data input pulse DINP and the selection data control signal SDMI. The fourth input driver 537 may drive the drive data control signal DMI_DRV to have the same logic level as the selection data control signal SDMI when the write operation or the pattern write operation is performed to generate the data input pulse DINP.

The core data generation circuit 55 may generate the core data CDQ based on the drive data DQ_DRV, the drive parity PRT_DRV, an error correction activation signal ECCEN, the drive data control signal DMI_DRV, and a write input pulse WINP. The error correction activation signal ECCEN may be generated to have a logic "high" level when an error correction operation is performed. The core data generation circuit 55 may generate a first internal data IDQ1 from the drive data DQ_DRV when the error correction operation is not performed and may generate the first internal data IDQ1 from the correction data CD generated by correcting an error included in the drive data DQ_DRV when the error correction operation is performed. The core data generation circuit 55 may generate a second internal data IDQ2 from the first internal data IDQ1 when a data inversion operation is not performed and may generate the second internal data IDQ2 by inversely buffering the first internal data IDQ1 when the data inversion operation is performed. The write input pulse WINP may be generated at a point in time when a predetermined write input delay period elapses from a point in time when the write command signal WT or the pattern write command signal WRX is generated. The predetermined write input delay period is set to be longer than an input delay period, for some embodiments. The core data generation circuit 55 may drive the core data CDQ based on the second internal data IDQ2 when the write input pulse WINP is generated.

The core data generation circuit 55 may include a syndrome generation circuit 551, an error correction circuit 553, a first internal data selection circuit 555, an inverter IV51, a second internal data generation circuit 557, and a first core driver 559 which are electrically connected in sequential order. The syndrome generation circuit 551 may generate a syndrome SYN based on the drive data DQ_DRV and the drive parity PRT_DRV. The syndrome generation circuit 551 may generate the syndrome SYN by performing a logical arithmetic operation of bits selected from bits included in the drive data DQ_DRV and the drive parity PRT_DRV according to an error check matrix used in the error correction code ECC. The syndrome SYN may include information on erroneous bits among the bits included in the drive data DQ_DRV. The error correction circuit 553 may generate the correction data CD by correcting at least one erroneous bit among the bits included in the drive data DQ_DRV, based on the syndrome SYN. The first internal data selection circuit 555 may output the drive data DQ_DRV or the correction data CD as the first internal data IDQ1 based on the error correction activation signal ECCEN. The first internal data selection circuit 555 may output the drive data DQ_DRV as the first internal data IDQ1 when the error correction activation signal ECCEN is not generated due to non-execution of the error correction operation. The first internal data selection circuit 555 may output the correction data CD as the first internal data IDQ1 when the error correction operation is performed to generate the error correction activation signal ECCEN. The inverter IV51 may inversely buffer the first internal data IDQ1 to output the inversely buffered data of first internal data IDQ1. The second internal data generation circuit 557 may output an output signal of the inverter IV51 or the first internal data IDQ1 as the second internal data IDQ2 based on the drive data control signal DMI_DRV. The second internal data generation circuit 557 may output the output signal of the inverter IV51 as the second internal data IDQ2 based on the drive data control signal DMI_DRV when the data inversion operation is performed. The second internal data generation circuit 557 may output the first internal data IDQ1 as the second internal data IDQ2 based on the drive data control signal DMI_DRV when the data inversion operation is not performed. The first core driver 559 may generate the core data CDQ based on the write input pulse WINP and the second internal data IDQ2. The first core driver 559 may drive the core data CDQ to have the same logic level as the second internal data IDQ2 when the write operation or the pattern write operation is performed to generate the write input pulse WINP.

The data masking control circuit 57 may generate a data masking signal CDM based on the drive data control signal DMI_DRV, the data inversion activation signal DBI_EN, and the write input pulse WINP. The data inversion activation signal DBI_EN may be generated to have a logic "high" level when the data inversion operation is performed. When the data inversion operation is performed, the data masking control circuit 57 may transmit the drive data control signal DMI_DRV to the core data generation circuit 55 such that the second internal data IDQ2 is generated from a signal obtained by inversely buffering the first internal data IDQ1. When the data inversion operation is performed, the data masking control circuit 57 may set the internal data masking signal IDM to the ground voltage VSS to prevent the data masking operation from being performed. When the data inversion operation is not performed, the data masking control circuit 57 may output the drive data control signal DMI_DRV as the internal data masking signal IDM. When the write input pulse WINP is generated, the data masking control circuit 57 may generate the data masking signal CDM from the internal data masking signal IDM.

The data masking control circuit 57 may include a data masking selection circuit 571 and a second core driver 573. The data masking selection circuit 571 may output the drive data control signal DMI_DRV or the ground voltage VSS as the internal data masking signal IDM based on the data inversion activation signal DBI_EN. The data masking selection circuit 571 may output the drive data control signal DMI_DRV as the internal data masking signal IDM when the data inversion activation signal DBI_EN has a logic "low" level due to non-execution of the data inversion operation. The data masking selection circuit 571 may output the ground voltage VSS as the internal data masking signal IDM when the data inversion activation signal DBI_EN has a logic "high" level due to execution of the data inversion operation. The second core driver 573 may drive the data masking signal CDM to have the same logic level as the internal data masking signal IDM when the write operation or pattern write operation is performed to generate the write input pulse WINP.

The memory core 59 may include a plurality of memory cell arrays (not illustrated) that store the core data CDQ based on the data masking signal CDM. When a masking operation is performed during the write operation, the memory core 59 may block storage of bits selected based on the data masking signal CDM among bits included in the core data CDQ.

Figure 8:
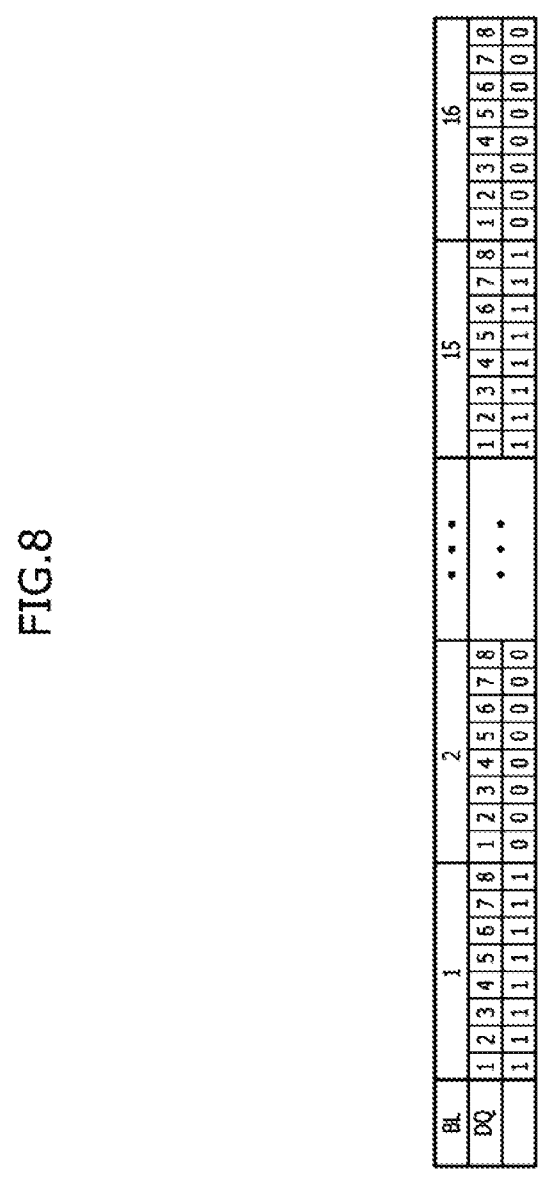

Referring to FIG. 8, the data DQ inputted to data pins are listed according to a burst length BL. All of first to eighth bits DQ<1:8> of the data inputted to first to eighth data pins may be set to have a logic "high" level when the burst length BL is "1," all of the first to eighth bits DQ<1:8> of the data inputted to the first to eighth data pins may be set to have a logic "low" level when the burst length BL is "2," all of the first to eighth bits DQ<1:8> of the data inputted to the first to eighth data pins may be set to have a logic "high" level when the burst length BL is "15," and all of the first to eighth bits DQ<1:8> of the data inputted to the first to eighth data pins may be set to have a logic "low" level when the burst length BL is "16." When the burst length BL is an odd number and all of the first to eighth bits DQ<1:8> of the data are set to have a logic "high" level, all of bits included in the first selection data SDQ1 may be set to have a logic "high" level during the write operation. When the burst length BL is an even number and all of the first to eighth bits DQ<1:8> of the data are set to have a logic "low" level, all of bits included in the second selection data SDQ2 may be set to have a logic "low" level during the write operation.

The semiconductor device 150b having the aforementioned configuration may set the first selection data SDQ1 or the second selection data SDQ2 to the power supply voltage VDD or the ground voltage VSS to use the syndrome generation circuit 551 and the error correction circuit 553, which are provided to perform the error correction operation, even for the pattern write operation without any design change of the syndrome generation circuit 551 and the error correction circuit 553. As a result, it may be possible to reduce a layout area and power consumption of the semiconductor device 150*b*. Further, the semiconductor device 150*b* may set the selection parity SPRT and the selection data control signal SDMI to the ground voltage VSS to use the second internal data generation circuit 557 provided to perform the data inversion operation and the data masking selection circuit 571 provided to perform the data masking operation even for the pattern write operation without any design change of the second internal data generation circuit 557 and the data masking selection circuit 571. Thus, it may also be possible to reduce a layout area and power consumption of the semiconductor device 150*b*.

According to the present disclosure, circuits provided to perform an error correction operation during a write operation may also be used for a pattern write operation without any design change by setting selection data and a selection parity generated by data and a parity during the write operation to a predetermined logic level during the pattern write operation. Thus, it may be possible to reduce a layout area and power consumption of a semiconductor device.

In addition, according to the present disclosure, circuits provided to perform a data inversion operation and a data masking operation during a write operation may also be used for a pattern write operation without any design change by setting a selection data control signal generated by a data control signal during the write operation to a predetermined logic level during the pattern write operation. Thus, it may be possible to reduce a layout area and power consumption of a semiconductor device.

Furthermore, according to the present disclosure, circuits provided to perform an error correction operation during a write operation may also be used for a pattern write operation without any design change by setting selection data and a selection parity to a predetermined logic level according to a burst flag during the pattern write operation. Thus, it may be possible to reduce a layout area and power consumption of a semiconductor device.

Moreover, according to the present disclosure, circuits provided to perform a data inversion operation and a data masking operation during a write operation may also be used for a pattern write operation without any design change by setting a selection data control signal to a predetermined logic level according to a burst flag during the pattern write operation. Thus, it may be possible to reduce a layout area and power consumption of a semiconductor device.

What is claimed is:

1. A semiconductor device comprising:
   a selection input circuit configured to generate selection data, a selection parity, and a selection data control signal from data, a parity, and a data control signal, respectively, during a write operation and configured to set the selection data, the selection parity, and the selection data control signal to a first voltage or a second voltage, respectively, during a pattern write operation; and
   a core data generation circuit configured to receive drive data, a drive parity, and a drive data control signal driven by the selection data, the selection parity, and the selection data control signal, respectively, and to selectively perform an error correction operation and a data inversion operation on the received drive data to generate core data which are stored into a memory core during the write operation and configured to set the core data to a predetermined logic value during the pattern write operation.

2. The semiconductor device of claim 1, wherein the selection input circuit is configured to receive a write command signal during the write operation and receive a first pattern control flag and a second pattern control flag during the pattern write operation.

3. The semiconductor device of claim 2, further comprising a command decoder configured to generate the write command signal, the first pattern control flag, and the second pattern control flag by decoding a control signal.

4. The semiconductor device of claim 2, further comprising a command decoder configured to generate the first pattern control flag to set the selection data to the first voltage, and to generate the second pattern control flag to set the selection data to the second voltage.

5. The semiconductor device of claim 1,
   wherein the selection parity is generated from the parity which is set according to an error check matrix used in the error correction operation when the write operation is performed; and
   wherein the selection parity is set to have the first voltage to block influence on the error correction operation when the pattern write operation is performed.

6. The semiconductor device of claim 1,
   wherein the selection data control signal is generated from the data control signal for controlling the data inversion operation and a data masking operation when the write operation is performed; and
   wherein the selection data control signal is set to have the first voltage to prevent the data inversion operation and the data masking operation from being performed when the pattern write operation is performed.

7. The semiconductor device of claim 1,
   wherein the core data generation circuit is configured to output the drive data as first internal data when the error correction operation is not performed; and
   wherein the core data generation circuit is configured to output correction data generated by correcting an error included in the drive data as the first internal data when the error correction operation is performed.

8. The semiconductor device of claim 7,
   wherein the core data generation circuit is configured to output the first internal data as second internal data when the data inversion operation is not performed;
   wherein the core data generation circuit is configured to inversely buffer the first internal data to output the inversely buffered data of the first internal data as the second internal data when the data inversion operation is performed; and
   wherein the core data generation circuit is configured to drive the core data based on the second internal data.

9. The semiconductor device of claim 1, further comprising a data masking control circuit configured to generate a data masking signal for controlling a data masking operation according to whether the data inversion operation is performed.

10. The semiconductor device of claim 9,
    wherein the data masking control circuit is configured to generate the data masking signal from the drive data control signal when the data inversion operation is not performed; and
    wherein the data masking control circuit is configured to generate the data masking signal to prevent the data masking operation from being performed when the data inversion operation is performed.

11. The semiconductor device of claim 1,
    wherein the selection data includes first selection data and second selection data; and
    wherein logic levels of the first selection data and the second selection data are set according to a burst length.

12. A semiconductor device comprising:
a selection data generation circuit configured to generate selection data from data during a write operation and configured to set the selection data to a first logic level or a second logic level based on a pattern control flag during a pattern write operation;
a selection parity generation circuit configured to generate a selection parity from a parity during the write operation and configured to set the selection parity to the first logic level during the pattern write operation;
a selection flag generation circuit configured to generate a selection data control signal from a data control signal during the write operation and configured to set the selection data control signal to the first logic level during the pattern write operation; and
a core data generation circuit configured to receive drive data, a drive parity, and a drive data control signal driven by the selection data, the selection parity, and the selection data control signal, respectively, and to selectively perform an error correction operation and a data inversion operation to generate core data which are stored into a memory core.

13. The semiconductor device of claim 12,
wherein the pattern control flag includes a first pattern control flag and a second pattern control flag; and
wherein logic levels of the selection data are set based on the first pattern control flag and the second pattern control flag.

14. The semiconductor device of claim 12,
wherein the selection parity is generated from the parity which is set according to an error check matrix used in the error correction operation when the write operation is performed; and
wherein the selection parity is set to have the first logic level to block influence on the error correction operation when the pattern write operation is performed.

15. The semiconductor device of claim 12,
wherein the selection data control signal is generated from the data control signal for controlling the data inversion operation and a data masking operation when the write operation is performed; and
wherein the selection data control signal is set to have the first logic level to block influence on the data inversion operation and the data masking operation when the pattern write operation is performed.

16. The semiconductor device of claim 12,
wherein the core data generation circuit is configured to output the drive data as first internal data when the error correction operation is not performed; and
wherein the core data generation circuit is configured to output correction data generated by correcting an error included in the drive data as the first internal data when the error correction operation is performed.

17. The semiconductor device of claim 16,
wherein the core data generation circuit is configured to output the first internal data as second internal data when the data inversion operation is not performed;
wherein the core data generation circuit is configured to inversely buffer the first internal data to output the inversely buffered data of the first internal data as the second internal data when the data inversion operation is performed; and
wherein the core data generation circuit is configured to drive the core data based on the second internal data.

18. The semiconductor device of claim 12, further comprising a data masking control circuit configured to generate a data masking signal for controlling a data masking operation according to whether the data inversion operation is performed.

19. The semiconductor device of claim 18,
wherein the data masking control circuit is configured to generate the data masking signal from the drive data control signal when the data inversion operation is not performed; and
wherein the data masking control circuit is configured to generate the data masking signal to prevent the data masking operation from being performed when the data inversion operation is performed.

20. The semiconductor device of claim 12,
wherein the selection data includes first selection data and second selection data; and
wherein logic levels of the first selection data and the second selection data are set according to a burst length.

* * * * *